(12) United States Patent
Xiao (10) Patent No.: US 12,267,923 B2
(45) Date of Patent: Apr. 1, 2025

(54) CONTROL CIRCUIT FOR BYPASSING DIODE CURRENT AND CONTROL METHOD

(71) Applicant: SHANGHAI HUIRUI SEMICONDUCTOR TECHNOLOGY CO., LTD., Shanghai (CN)

(72) Inventor: Chuan Xiao, Shenzhen (CN)

(73) Assignee: SHENZHEN INJOINIC TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/011,527

(22) PCT Filed: Sep. 9, 2020

(86) PCT No.: PCT/CN2020/114133
§ 371 (c)(1),
(2) Date: Dec. 20, 2022

(87) PCT Pub. No.: WO2022/000774
PCT Pub. Date: Jan. 6, 2022

(65) Prior Publication Data
US 2023/0284353 A1    Sep. 7, 2023

(30) Foreign Application Priority Data

Jun. 29, 2020  (CN) .......................... 202010608456.1
Jun. 29, 2020  (CN) .......................... 202021235241.1

(51) Int. Cl.
*H05B 45/40*   (2020.01)
*H05B 45/345*  (2020.01)

(52) U.S. Cl.
CPC ........... *H05B 45/345* (2020.01); *H05B 45/40* (2020.01)

(58) Field of Classification Search
CPC .... H05B 45/40; H05B 45/345; H05B 45/397; H03K 17/08; H03K 17/16
See application file for complete search history.

(56) References Cited

U.S. PATENT DOCUMENTS 6,498,738 B1 *  12/2002  Orita ...................... H03K 17/18
                                                        363/73
7,436,244 B2 *  10/2008  Lin  .......................... G05F 3/30
                                                        327/539
(Continued)

FOREIGN PATENT DOCUMENTS

CN          101043181 A          9/2007
CN          102857135 A          1/2013
(Continued)

*Primary Examiner* — Tung X Le
(74) *Attorney, Agent, or Firm* — IPro, PLLC (57) ABSTRACT

A control circuit for bypassing a diode current and a control method are provided; the control circuit includes a main module, a diode-current sensing module, a driving module; the diode-current sensing module is for sensing a current flowing through a main diode to generate a sensing current; the driving module is for generating a driving current proportional to the sensing current to drive a main switching transistor to be turned on; the main module, the diode-current sensing module, the driving module form a negative feedback loop to reduce the current flowing through the main diode to a preset value. The present disclosure solves problems in the related art, such as heat generation caused by large currents flowing through a body diode or flyback diode when the main switching transistor is in an off cycle, and the control circuit being out of control due to large currents introduced into a substrate.

14 Claims, 4 Drawing Sheets

(56) References Cited

U.S. PATENT DOCUMENTS

| | | | | |
|---|---|---|---|---|
| 8,093,881 B2 * | 1/2012 | Fujiyama | ............ | H03F 3/45183 323/901 |
| 2009/0015220 A1 * | 1/2009 | Nagasawa | ............. | H02M 3/156 323/271 |
| 2011/0180710 A1 * | 7/2011 | Bluzer | ...................... | G01J 5/24 250/340 |
| 2014/0016361 A1 * | 1/2014 | Weis | ....................... | H02M 7/25 363/21.02 |
| 2020/0357791 A1 * | 11/2020 | Noebauer | ........... | H01L 27/0629 |

FOREIGN PATENT DOCUMENTS

| | | |
|---|---|---|
| CN | 104767379 A | 7/2015 |
| CN | 106664014 A | 5/2017 |
| CN | 111555740 | 8/2020 |
| JP | 2010259241 | 11/2010 |
| WO | 2016189804 A | 12/2016 |

\* cited by examiner

CONTROL CIRCUIT FOR BYPASSING DIODE CURRENT AND CONTROL METHOD

TECHNICAL FIELD

The present disclosure relates to the field of integrated circuits, in particular, to a control circuit for bypassing a diode current and a control method.

BACKGROUND

As the public pays more and more attention to high efficiency and environmental protection, power devices with ever increasing efficiency, such as, power metal-oxide-semiconductor field-effect transistors (power MOSFETs), insulated gate bipolar transistors (IGBTs), silicon carbide (SiC), gallium nitride (GaN), are being developed, and how to further increase their efficiency and reduce heat generation has become an important goal of engineers.

When power MOSFETs, IGBTs, SiC, GaN, etc. are used in power supplies or are used as main switching transistors, large currents will flow from body diodes or flyback diodes during an off cycle of these main switching transistors; for example, when power MOSFETs are used as switching power supplies, large currents will flow from the body diodes of the power MOSFETs during switching; for another example, in batteries of portable devices, large discharging currents and large charging currents flow from body diodes of MOSFET separators during over-voltage protection and under-voltage protection, to protect the MOSFETs; for example, in efficient and energy-saving direct-current motor drive applications, power switching transistors, such as, IGBTs, SiC, GaN, will have flyback diodes, so that tens or hundreds of amperes of currents generated when an upper or a lower bridge drives the main switching transistor to be turned off will flow through the flyback diodes to drive motors to work.

Since large currents flowing through body diodes or flyback diodes often lead to heat generation and even a circuit's logic, may be confused due to excessive currents flowing through its substrate, thus preventing the circuit from operating properly; therefore, engineers have been searching for a solution for the above problems.

SUMMARY

The present disclosure provides a control circuit for bypassing a diode current and a control method, which are for solving problems in the related art, such as heat generation caused by large currents flowing through a body diode or a flyback diode when a main switching transistor is in an off cycle, and the control circuit being out of control due to large currents introduced into a substrate.

The present disclosure provides a control circuit for bypassing a diode current; the control circuit includes a main module, a diode-current sensing module, and a driving module.

the main module includes a main switching transistor and a main diode, the main diode is connected in parallel with the main switching transistor, and connected to a source and a drain of the main switching transistor;
the diode-current sensing module is connected to two ends of the main diode, and is for sensing a current flowing through the main diode to generate a sensing current;
the driving module is connected to an output terminal of the diode-current sensing module and a gate of the main switching transistor respectively, and is for generating a driving current proportional to the sensing current to drive the main switching transistor to be turned on;
the main module, the diode-current sensing module, and the driving module form a negative feedback loop to reduce the current flowing through the main diode to a preset value.

In an embodiment, the diode-current sensing module includes a sensing diode; the sensing diode senses the current flowing through the main diode and generates the sensing current, by making a voltage across the sensing diode positively related to or equal to a voltage across the main diode.

In an embodiment, the diode-current sensing module includes an error amplifier, a source follower transistor, and the sensing diode; a non-inverting input terminal of the error amplifier is connected to an anode of the main diode, an inverting input terminal of the error amplifier is connected to a source of the source follower transistor and an anode of the sensing diode respectively, an output terminal of the error amplifier is connected to a gate of the source follower transistor, a drain of the source follower transistor is used as the output terminal of the diode-current sensing module, and a cathode of the sensing diode is connected to a cathode of the main diode.

In an embodiment, the diode-current sensing module includes a bias current source, a first common-gate transistor, a second common-gate transistor, a sensing switching transistor, and the sensing diode; an input terminal of the bias current source is connected to a supply voltage, an output terminal of the bias current source is connected to a drain of the first common-gate transistor, a source of the first common-gate transistor is connected to an anode of the main anode, a gate of the first common-gate transistor is connected to the drain of the first common-gate transistor and a gate of the second common-gate transistor respectively, a drain of the second common-gate transistor is used as the output terminal of the diode-current sensing module, a source of the second common-gate transistor is connected to a source of the sensing switching transistor and an anode of the sensing diode respectively, a gate of the sensing switching transistor is connected to the source of the sensing switching transistor, a drain of the sensing switching transistor is connected to a cathode of the sensing diode and a cathode of the main diode respectively.

In an embodiment, the diode-current sensing module further includes a first resistor, the first resistor is connected between the source of the first common-gate transistor and the anode of the main diode.

In an embodiment, the diode-current sensing module further includes a first resistor and a second resistor; the first resistor is connected between the source of the first common-gate transistor and the anode of the main diode, and the second resistor is connected between the source of the second common-gate transistor and the anode of the sensing diode.

In an embodiment, the driving module includes a first current mirror transistor, a second current mirror transistor, and a driving resistor; a source of the first current mirror transistor is connected to a source of the second current mirror transistor and then to a supply voltage, a drain of the first current mirror transistor is connected to the output terminal of the diode-current sensing module, a gate of the first current mirror transistor is connected to the drain of the first current mirror transistor and a gate of the second current mirror transistor respectively, a drain of the second current mirror transistor is connected to a first terminal of the driving resistor and is used as an output terminal of the driving module, and a second terminal of the driving resistor is connected to a switching control signal of the main switching transistor.

In an embodiment, the driving module includes a first current mirror transistor, a second current mirror transistor, a sampling resistor, an N-metal-oxide-semiconductor (NMOS) driving transistor, and a P-metal-oxide-semiconductor (PMOS) driving transistor; a source of the first current mirror transistor is connected to a source of the second current mirror transistor and then connected to a supply voltage, a drain of the first current mirror transistor is connected to the output terminal of the diode-current sensing module, a gate of the first current mirror is connected to the drain of the first current mirror transistor and a gate of the second current mirror transistor respectively, a drain of the second current mirror transistor is connected to a first terminal of the sampling resistor, a gate of the NMOS driving transistor and a gate of the PMOS driving transistor respectively, a second terminal of the sampling resistor is connected to a source of the main switching transistor, a drain of the NMOS driving transistor is connected to the supply voltage, a source of the NMOS driving transistor is connected to a source of the PMOS driving transistor and is used as an output terminal of the driving module, the output terminal of the driving module is connected to a gate of the main switching transistor, and a drain of the PMOS driving transistor is connected to the source of the main switching transistor; a threshold voltage of the PMOS driving transistor is less than a threshold voltage of the main switching transistor.

In an embodiment, the driving module further includes a PMOS switching transistor; a source of the PMOS switching transistor is connected to the supply voltage, a drain of the PMOS switching transistor is connected to the gate of the NMOS driving transistor, and a gate of the PMOS switching transistor is connected to a switching control signal of the PMOS switching transistor.

In an embodiment, the driving module includes a first current mirror transistor, a second current mirror transistor, a sampling resistor, a first triode, and a second triode; a source of the first current mirror transistor is connected to a source of the second current mirror transistor and then connected to a supply voltage, a drain of the first current mirror transistor is connected to the output terminal of the diode-current sensing module, a gate of the first current mirror transistor is connected to the drain of the first current mirror transistor and a gate of the second current mirror transistor respectively, a drain of the second current mirror transistor is connected to a first terminal of the sampling resistor, a base of the first triode and a base of the second triode respectively, a second terminal of the sampling resistor is connected to a source of the main switching transistor, a collector of the first triode being is connected to the supply voltage, an emitter of the first triode is connected to an emitter of the second triode and is used as an output terminal of the driving module, the output terminal of the driving module is connected to a gate of the main switching transistor, a collector of the second triode is connected to the source of the main switching transistor; a turn-on voltage of the second triode is less than a threshold voltage of the main switching transistor.

In an embodiment, the driving module further includes a PMOS switching transistor; a source of the PMOS switching transistor is connected to the supply voltage, a drain of the PMOS switching transistor is connected to a base of the first triode, and a gate of the PMOS switching transistor is connected to a switching control signal of the PMOS switching transistor.

In an embodiment, the control circuit further includes a current threshold module, connected between the diode-current sensing module and the driving module, for comparing the sensing current with a preset threshold current, turning off the driving module when a magnitude of the sensing current is less than that of the preset threshold current, and turning on the driving module when the magnitude of the sensing current is greater than that of the preset threshold current.

In an embodiment, the current threshold module includes a threshold current source, an input terminal of the threshold current source is connected to the supply voltage, and an output terminal of the threshold current source is connected to an output of the diode-current sensing module and an input terminal of the driving module respectively.

The present disclosure provides a control method, for performing current bypassing on a main diode, the main diode is connected in parallel with a main switching transistor, and connected to a source and a drain of the main switching transistor, the control method includes:
  sensing, by a diode-current sensing module, a current flowing through the main diode to generate a sensing current; and
  generating, by a driving module, a driving current proportional to the sensing current to drive the main switching transistor to be turned on;
  the main module, the diode-current sensing module, and the driving module form a negative feedback loop to reduce the current flowing through the main diode to a preset value.

In an embodiment, the step of sensing the current flowing through the main diode to generate the sensing current includes: sensing the current flowing through the main diode and generating the sensing current by making a voltage across a sensing diode in the diode-current sensing module positively related to or equal to a voltage across the main diode.

In an embodiment, after the step of sensing the current flowing through the main diode to generate the sensing current, the control method further includes: comparing the sensing current with a preset threshold current, turning off the driving module when a magnitude of the sensing current is less than that of the preset threshold current, turning on the driving module when the magnitude of the sensing current is greater than that of the preset threshold current.

As described above, the control circuit for bypassing the diode current and the control method use the negative feedback loop formed by the main module, the diode-current sensing module, and the driving module to turn on the main switching transistor, thereby bypassing and regulating the current flowing through the main diode, reducing the current flowing through the main diode to the preset value, and controlling the current flowing through the main diode so that it is within a limited range. The preset disclosure has a negative feedback attribute. A turn-on threshold (i.e., the preset threshold current) may also be configured so that it can be used to automatically turn on or turn off the circuit. The circuit structure of the preset disclosure is simple and easy to implement.

REFERENCE NUMERALS

101 Main module
102 Diode-current sensing module
103 Driving module
104 Current threshold module

DETAILED DESCRIPTION

The embodiments of the present disclosure will be described below through exemplary embodiments. Those skilled in the art can easily understand other advantages and effects of the present disclosure according to contents disclosed by the specification. The present disclosure may also be implemented or applied through other different specific implementations. Various details in this specification may also be modified or changed based on different viewpoints and applications without departing from the spirit of the present disclosure.

Reference is made to FIGS. 1 to 7. It should be noted that, the drawings provided herein only exemplify the basic idea of the present disclosure. Although only the components related to the present disclosure are shown in the drawings, they are not necessarily drawn according to the quantities, shapes, and sizes of the components during actual implementation. During actual implementation, the patterns, quantities, and proportions of the components may be changed as needed, and the layout of the components may be more complicated.

Embodiment 1

Figure 1:
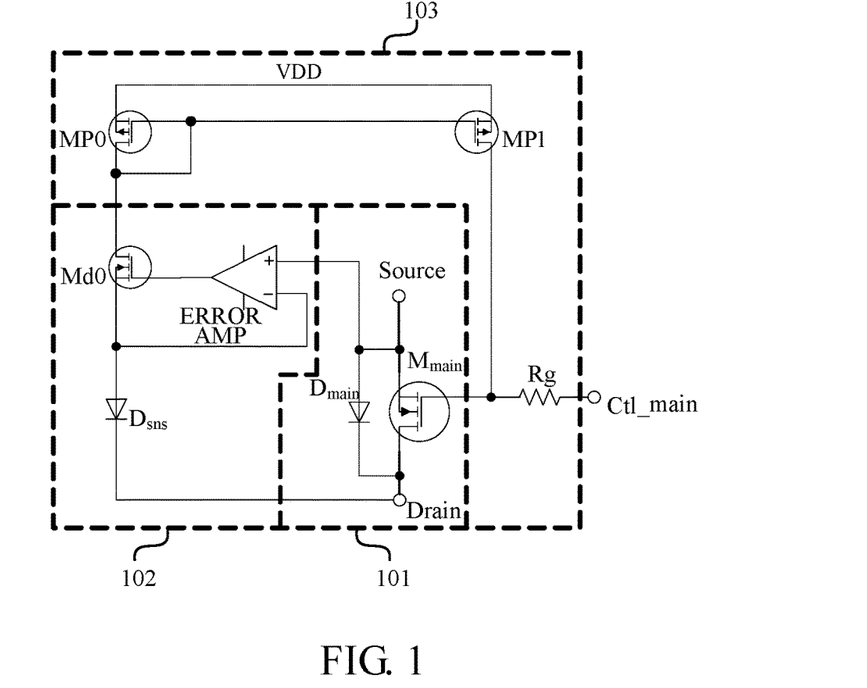
FIG. 1 shows an implementation of a control circuit for bypassing a diode current according to Embodiment 1 of the present disclosure.

As shown in FIG. 1, Embodiment 1 provides a control circuit for bypassing a diode current; the control circuit includes a main module 101, a diode-current sensing module 102, and a driving module 103. Herein, "bypassing a current" refers to making the current go around a certain component.

The main module 101 includes a main switching transistor $M_{main}$ and a main diode $D_{main}$; the main diode $D_{main}$ is connected in parallel with the main switching transistor $M_{main}$, and connected to a source and a drain of the main switching transistor $M_{main}$.

The diode-current sensing module 102 is connected to two ends of the main diode $D_{main}$, and is for sensing a current flowing through the main diode $D_{main}$ to generate a sensing current.

The driving module 103 is connected to an output terminal of the diode-current sensing module 102 and a gate of the main switching transistor $M_{main}$ respectively, and is for generating a driving current proportional to the sensing current to drive the main switching transistor $M_{main}$ to be turned on;

The main module 101, the diode-current sensing module 102, and the driving module 103 form a negative feedback loop, to reduce the current flowing through the main diode $D_{main}$ to a preset value.

As an example, the main switching transistor $M_{main}$ includes one of power MOSFETs, IGBTs, SiC transistors and GaN transistors, and the main diode $D_{main}$ is a body diode or a flyback diode of the main switching transistor $M_{main}$.

As an example, the diode-current sensing module 102 includes a sensing diode $D_{sns}$. The sensing diode $D_{sns}$ senses the current flowing through the main diode $D_{main}$ and generates the sensing current, by making a voltage across the sensing diode $D_{sns}$ positively related to or equal to a voltage across the main diode $D_{main}$.

As shown in FIG. 1, in an example, the diode-current sensing module 102 includes an error amplifier ERROR AMP, a source follower transistor Md0, and the sensing diode $D_{sns}$; a non-inverting input terminal of the error amplifier ERROR AMP is connected to an anode of the main diode $D_{main}$, an inverting input terminal of the error amplifier ERROR AMP is connected to a source of the source follower transistor Md0 and an anode of the sensing diode $D_{sns}$ respectively, an output terminal of the error amplifier ERROR AMP is connected to a gate of the source follower transistor Md0, a drain of the source follower transistor Md0 is used as the output terminal of the diode-current sensing module 102, and a cathode of the sensing diode $D_{sns}$ is connected to a cathode of the main diode $D_{main}$. The sensing diode $D_{sns}$ and the main diode $D_{main}$ are of the same type, and they differ only in their junction areas; specifically, the ratio of a junction area of the sensing diode $D_{sns}$ to a junction area of the main diode $D_{main}$ is 1/N, where N is a positive number.

In one example, the error amplifier ERROR AMP and the source follower transistor Md0 form an negative feedback circuit, so that a voltage at the anode of the sensing diode $D_{sns}$ is equal to a voltage at the source of the main switching transistor $M_{main}$, i.e., the voltage at the anode of the sensing diode $D_{sns}$ is equal to a voltage at the anode of the main diode $D_{main}$; since the cathode of the sensing diode $D_{sns}$ is connected to the cathode of the main diode $D_{main}$, a voltage at the cathode of the sensing diode $D_{sns}$ is also equal to a voltage at the cathode of the main diode $D_{main}$, so that a voltage difference between the anode and the cathode of the sensing diode $D_{sns}$ is equal to a voltage difference between the anode and the cathode of the main diode $D_{main}$; at this time, the current ID_main flowing through the main diode $D_{main}$ and the current ID_sns flowing through the sensing diode $D_{sns}$ satisfy the following formula: ID_sns:ID_main=1:N, therefore the current flowing through the main diode $D_{main}$ can be precisely sensed by the sensing diode $D_{sns}$.

Figure 2:
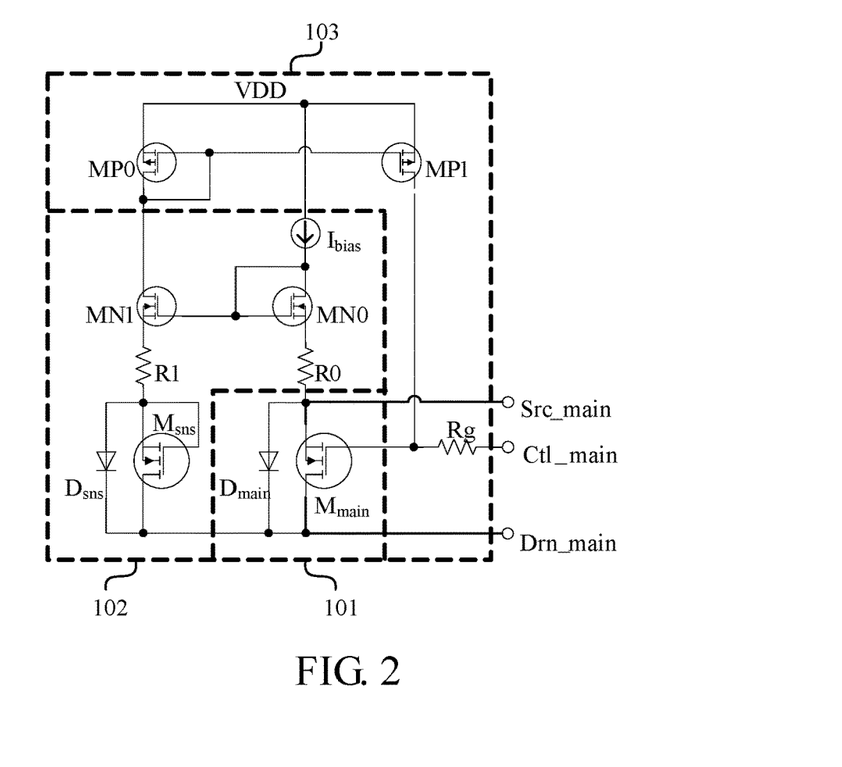
FIG. 2 shows an alternative implementation of a diode-current sensing module in a control circuit for bypassing a diode current of the present disclosure.

As shown in FIG. 2, in another example, the diode-current sensing module 102 includes a bias current source $I_{bias}$, a first common-gate transistor MN0, a second common-gate transistor MN1, a sensing switching transistor $M_{sns}$, and the sensing diode $D_{sns}$; an input terminal of the bias current source $I_{bias}$ is connected to a supply voltage VDD, an output terminal of the bias current source $I_{bias}$ is connected to a drain of the first common-gate transistor MN0, a source of the first common-gate transistor MN0 is connected to an anode of the main diode $D_{main}$, a gate of the first common-gate transistor MN0 is connected to the drain of the first common-gate transistor MN0 and a gate of the second common-gate transistor MN1 respectively, a drain of the second common-gate transistor MN1 is used as the output terminal of the diode-current sensing module 102, a source of the second common-gate transistor MN1 is connected to a source of the sensing switching transistor $M_{sns}$ and an anode of the sensing diode $D_{sns}$ respectively, a gate of the sensing switching transistor $M_{sns}$ is connected to the source of the sensing switching transistor $M_{sns}$, a drain of the sensing switching transistor $M_{sns}$ is connected to a cathode of the sensing diode $D_{sns}$ and a cathode of the main diode $D_{main}$ respectively. The sensing switching transistor $M_{sns}$ and the main switching transistor $M_{main}$ are of the same type and they differ only in their width to length ratios; a ratio of a width to length ratio of the sensing switching transistor $M_{sns}$ width to length ratio of the main switching transistor $M_{main}$ is 1/N, where N is a positive number.

In one example, the first common-gate transistor MN0 and the second common-gate transistor MN1 form a common-gate circuit, a voltage at the source of the first common-gate transistor MN0 is used as a reference voltage and a voltage at the source of the second common-gate transistor MN1 is used as a regulation voltage; the voltage at the source of the first common-gate transistor MN0 is generated when the current flows through the main diode $D_{main}$, the sum of the voltage at the source of the first common-gate transistor MN0 and a gate-source voltage of the first common-gate transistor MN0 is used as a voltage at the gate of the second common-gate transistor MN1; when biased by the voltage at the gate of the second common-gate transistor MN1, the second common-gate transistor MN1 generates the current flowing through the sensing diode $D_{sns}$; as the magnitude of the current flowing through the sensing diode $D_{sns}$ increases, the voltage at the source of the second common-gate transistor MN1 will increase until it is equal to the voltage at the source of the first common-gate transistor MN0; the regulation voltage of the second common-gate transistor MN1 is adjusted according to the reference voltage of the first common-gate transistor MN0 until the two are equal, so that the voltage at the source of the second common-gate transistor MN1 is always equal to the voltage at the source of the first common-gate transistor MN0, that is, the voltage at the anode of the sensing diode $D_{sns}$ is equal to the voltage at the anode of the main diode $D_{main}$, and since the cathode of the sensing diode $D_{sns}$ is connected to the cathode of the main diode $D_{main}$, a voltage at the cathode of the sensing diode $D_{sns}$ is also equal to a voltage at the cathode of the main diode $D_{main}$, so that a voltage difference between the anode and the cathode of the sensing diode $D_{sns}$ is equal to a voltage difference between the anode and the cathode of the main diode $D_{main}$; at this time, the current ID_main flowing through the main diode $D_{main}$ and the current ID_sns flowing through the sensing diode $D_{sns}$ satisfy the following formula: ID_sns:ID_main=1:N, therefore the current flowing through the main diode $D_{main}$ can be precisely sensed by the sensing diode $D_{sns}$.

As shown in FIG. 2, in another example, the diode-current sensing module 102 further includes a first resistor R0; the first resistor R0 is connected between the source of the first common-gate transistor MN0 and the anode of the main diode $D_{main}$, and is for introducing a corresponding direct-current component to fine-tune a voltage relationship between the main diode $D_{main}$ and the sensing diode $D_{sns}$. In another example, the diode-current sensing module 102 can also include a second resistor R1 and the first resistor R0; the second resistor R1 is connected between the source of the second common-gate transistor MN1 and the anode of the sensing diode $D_{sns}$.

As an example, as shown in FIGS. 1 and 2, the driving module 103 includes a first current mirror transistor MP0, a second current mirror transistor MP1, and a driving resistor Rg; a source of the first current mirror transistor MP0 is connected to a source of the second current mirror transistor MP1 and then connected to a supply voltage VDD, a drain of the first current mirror transistor MP0 is connected to the output terminal of the diode-current sensing module 102, a gate of the first current mirror transistor MP0 is connected to the drain of the first current mirror transistor MP0 and a gate of the second current mirror transistor MP1 respectively, a drain of the second current mirror transistor MP1 is connected to a first terminal of the driving resistor Rg and is used as an output terminal of the driving module 103, a second terminal of the driving resistor Rg is connected to a switching control signal Crl_main of the main switching transistor $M_{main}$. It should be noted that the switching control signal Crl_main of the main switching transistor $M_{main}$ is a control signal generated by an external circuit to turn on or turn off the main switching transistor $M_{main}$, thereby controlling whether the main switching transistor $M_{main}$ is in an on cycle or an off cycle.

In one example, the first current mirror transistor MP0 and the second current mirror transistor MP1 form a current mirror, and are for generating a driving current Idrv proportional to the sensing current ID_sns (the sensing current ID_sns and the driving current Idrv satisfy the following formula: Idrv=M*ID_sns, M is the magnification of the current mirror); the driving current Idrv flows through the driving resistor Rg to generate a corresponding driving voltage, and the corresponding driving voltage can drive the main switching transistor $M_{main}$ to be turned on, that is, the main switching transistor $M_{main}$ can be turned on during its off cycle.

Figure 3:
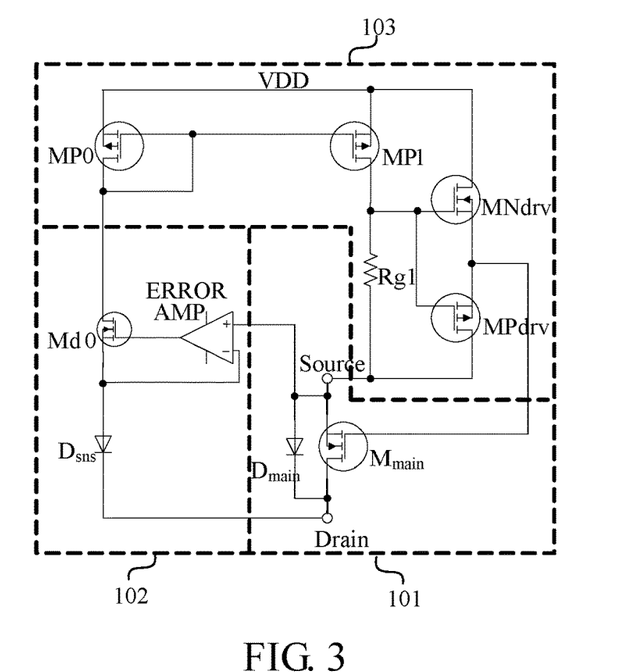
FIG. 3 shows an alternative implementation of a driving module in a control circuit for bypassing a diode current of the present disclosure.

In another example, as shown in FIG. 3, the driving module 103 includes a first current mirror transistor MP0, a second current mirror transistor MP1, a sampling resistor Rg1, an N-metal-oxide-semiconductor (NMOS) driving transistor MNdrv, and a P-metal-oxide-semiconductor (PMOS) driving transistor MPdrv; a source of the first current mirror transistor MP0 is connected to a source of the second current mirror transistor MP1 and then connected to the supply voltage VDD, a drain of the first current mirror transistor MP0 is connected to the output terminal of the diode-current sensing module 102, a gate of the first current mirror transistor MP0 is connected to the drain of the first current mirror transistor MP0 and a gate of the second current mirror transistor MP1 respectively, a drain of the second current mirror transistor MP1 is connected to a first terminal of the sampling resistor Rg1, a gate of the NMOS driving transistor MNdrv and a gate of the PMOS driving transistor MPdrv respectively, a second terminal of the sampling resistor Rg1 is connected to a source of the main switching transistor $M_{main}$, a drain of the NMOS driving transistor MNdrv is connected to the supply voltage VDD, a source of the NMOS driving transistor MNdrv is connected to a source of the PMOS driving transistor MPdrv and is used as an output terminal of the driving module 103, the output terminal of the driving module 103 is connected to a gate of the main switching transistor $M_{main}$, and a drain of the PMOS driving transistor MPdrv is connected to the source of the main switching transistor $M_{main}$; a threshold voltage of the PMOS driving transistor MPdrv is less than a threshold voltage of the main switching transistor $M_{main}$.

In one example, the first current mirror transistor MP0 and the second current mirror transistor MP1 form a current mirror, and are for generating the driving current Idrv proportional to the sensing current ID_sns (the sensing current ID_sns and the driving current Idrv satisfy the following formula: Idrv=M*ID_sns, M is the magnification of the current mirror); the driving current Idrv flows through the sampling transistor Rg1 to generate a corresponding driving voltage, and the corresponding driving voltage can drive the NMOS driving transistor MNdrv and the PMOS driving transistor MPdrv to be turned on, so that the main switching transistor $M_{main}$ can be turned on during its off cycle. Since a threshold voltage of the PMOS driving transistor MPdrv is less than a threshold voltage of the main switching transistor $M_{main}$, the driving module 103 in this example has its own current-shutdown threshold, where the current-shutdown threshold is a ratio of a difference between the threshold voltage of the main switching transistor $M_{main}$ and the threshold voltage of the PMOS driving transistor MPdrv to a resistance value $R_{g1}$ of the sampling resistor Rg1, that is, (Vth_main−Vth_MPdrv)/$R_{g1}$, where Vth_main is the threshold voltage of the main switching transistor $M_{main}$, Vth_MPdrv is the threshold voltage of the PMOS driving transistor MPdrv, $R_{g1}$ is the resistance value of the sampling resistor Rg1.

Figure 4:
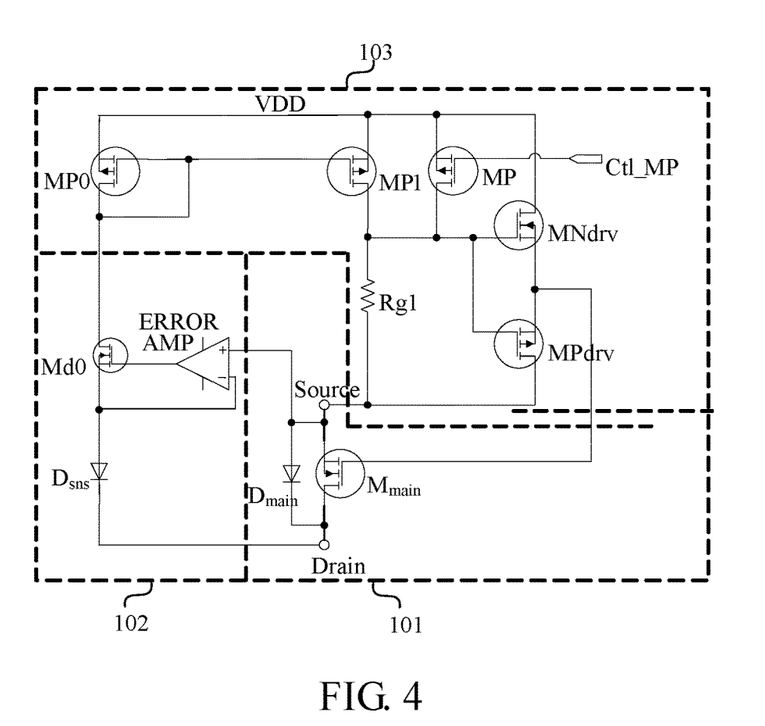
FIG. 4 shows an alternative implementation of a driving module in a control circuit for bypassing a diode current of the present disclosure.

In another example, as shown in FIG. 4, compared to the previous example (the example described in FIG. 3), the driving module 103 described in this example further includes a PMOS switching transistor MP; a source of the PMOS switching transistor MP is connected to the supply voltage VDD, a drain of the PMOS switching transistor MP is connected to the gate of the NMOS driving transistor MNdrv, and a gate of the PMOS switching transistor MPdrv is connected to a switching control signal Ctl_MP of the PMOS switching transistor MPdrv. It should be noted that the switching control signal Ctl_MP of the PMOS switching transistor MP is an external control signal, and is for turning on or turning off the NMOS driving transistor MNdrv and the PMOS driving transistor MPdrv, thereby enabling external control of the driving module 103.

Figure 5:
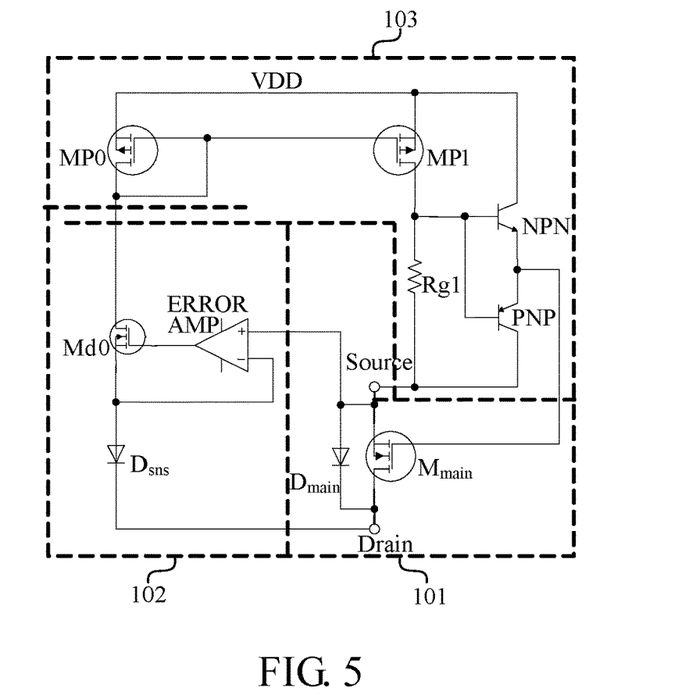
FIG. 5 shows an alternative implementation of a driving module in a control circuit for bypassing a diode current of the present disclosure.

In another example, as shown in FIG. 5, the driving module 103 includes a first current mirror transistor MP0, a second current mirror transistor MP1, a sampling resistor Rg1, a first triode NPN, and a second triode PNP; a source of the first current mirror transistor MP0 is connected to a source of the second current mirror transistor MP1 and then connected to the supply voltage VDD, a drain of the first current mirror transistor MP0 is connected to the output terminal of the diode-current sensing module 102, a gate of the first current mirror transistor MP0 is connected to the drain of the first current mirror transistor MP0 and a gate of the second current mirror transistor MP1 respectively, a drain of the second current mirror transistor MP1 is connected to a first terminal of the sampling resistor Rg1, a base of the first triode NPN and a base of the second triode PNP respectively, a second terminal of the sampling resistor Rg1 is connected to a source of the main switching transistor $M_{main}$, a collector of the first triode NPN is connected to the supply voltage VDD, an emitter of the first triode NPN is connected to an emitter of the second triode PNP and is used as an output terminal of the driving module 103, the output terminal of the driving module 103 is connected to a gate of the main switching transistor $M_{main}$, a collector of the second triode PNP is connected to the source of the main switching transistor $M_{main}$; a turn-on voltage of the second triode PNP is less than the threshold voltage of the main switching transistor $M_{main}$.

In one example, the first current mirror transistor MP0 and the second current mirror transistor MP1 form a current mirror, and are for generating the driving current Idrv proportional to the sensing current ID_sns (the sensing current ID_sns and the driving current Idrv satisfy the following formula: Idrv=M*ID_sns, M is the magnification of the current mirror); the driving current Idrv flows through the sampling resistor Rg1 to generate a corresponding driving voltage, and the corresponding driving voltage can drive the first triode NPN and the second triode PNP to be turned on, so that the main switching transistor $M_{main}$ can be turned on during its off cycle. Since a turn-on voltage of the second triode PNP is less than the threshold voltage of the main switching transistor $M_{main}$, the driving module 103 of this example has its own current-off threshold, where the current-off threshold is a ratio of a difference between the threshold voltage of the main switching transistor $M_{main}$ and a voltage difference between the base and the emitter of the second triode PNP to the resistance value $R_{g1}$ of the sampling resistor Rg1, that is, (Vth_main−Vbe_PNP)/$R_{g1}$, where Vbe_PNP is the voltage difference between the base and the emitter of the second triode PNP.

Figure 6:
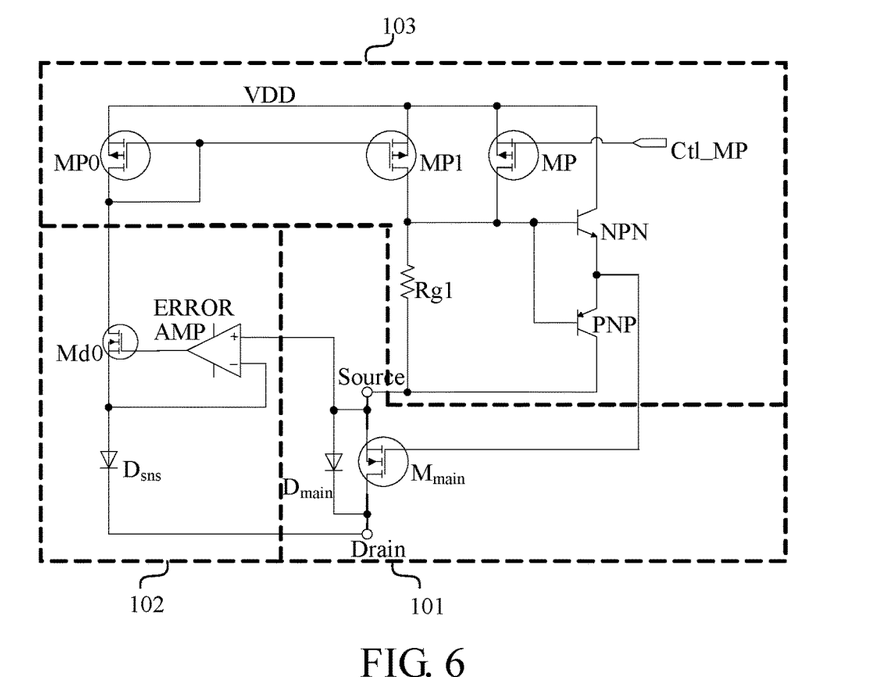
FIG. 6 shows an alternative implementation of a driving module in a control circuit for bypassing a diode current of the present disclosure.

In another example, as shown in FIG. 6, compared to the previous example (the example described in FIG. 5), the driving module 103 described in this example further includes a PMOS switching transistor MP; a source of the PMOS switching transistor MP is connected to the supply voltage VDD, a drain of the PMOS switching transistor MP is connected to a base of the first triode NPN, and a gate of the PMOS switching transistor MP is connected to a switching control signal Ctl_MP of the PMOS switching transistor MP. It should be noted that the switching control signal Ctl_MP of the PMOS switching transistor MP is an external control signal, and is for turning on or turning off the first triode NPN and the second triode PNP, thereby enabling external control of the driving module 103.

Accordingly, the present disclosure also provides a control method, for performing current bypassing on a main diode $D_{main}$, wherein the main diode $D_{main}$ is connected in parallel with a main switching transistor $M_{main}$, and particularly connected to a source and a drain of the main switching transistor $M_{main}$; the control method includes:

sensing, by a diode-current sensing module 102, a current flowing through the main diode $D_{main}$ to generate a sensing current; and generating, by a driving module 103, a driving current proportional to the sensing current to drive the main switching transistor $M_{main}$ to be turned on.

The main module 101, the diode-current sensing module 102, and the driving module 103 form a negative feedback loop to reduce the current flowing through the main diode $D_{main}$ to a preset value.

As an example, the step of sensing the current flowing through the main diode $D_{main}$ to generate the sensing current includes: sensing the current flowing through the main diode $D_{main}$ and generating the sensing current by making a voltage across a sensing diode in the diode-current sensing module 102 positively related to or equal to a voltage across the main diode $D_{main}$.

Referring to FIG. 1, the operation of the control circuit for bypassing the diode current is described in detail below, wherein the main switching transistor $M_{main}$ is in an off cycle under the action of the switching control signal Ctl_main of the main switching transistor $M_{main}$, wherein the switching control signal Ctl_main is generated by an external circuit.

As shown in FIG. 1, during the off cycle of the main switching transistor $M_{main}$, the diode-current sensing module 102 senses and detects a forward current flowing through the main diode $D_{main}$ and generates the sensing current, the driving module 103 amplifies the sensing current by M times to generate the driving current, and the driving current flows through the driving transistor Rg to generate a voltage at the gate of the main switching transistor $M_{main}$, so that the voltage at the gate of the main switching transistor $M_{main}$ drives the main switching transistor $M_{main}$ to be turned on and to generate a turn-on current during its off cycle. At this time, the turn-on current flowing through the main switching transistor $M_{main}$ increases from zero to the value of the current ID_$M_{main}$, and since the total current flowing through the system is of a fixed value, the current flowing through the main diode $D_{main}$ decreases by the value of the current ID_$M_{main}$ when the turn-on current flowing through the main switching transistor $M_{main}$ increases from zero to the value of the current ID_$M_{main}$; at this time, the sensing current sensed by the diode-current sensing module 102 decreases by a corresponding proportion, the driving module 103 amplifies the decreased sensing current by M times to generate an amplified sensing current, and the amplified sensing current flows through the driving resistor Rg to generate a gate voltage at the gate of the main switching transistor $M_{main}$. A small gate voltage will reduce the current ID_$M_{main}$ flowing through the main switching transistor $M_{main}$, in which case when the total current flowing through the system is a fixed value, the current flowing through the main diode $D_{main}$ will increase, thus forming the negative feedback loop. This negative feedback loop will keep the whole loop in a steady state so that the forward current flowing through the main diode $D_{main}$ is reduced to the preset value; when the magnitude of the forward current flowing through the main diode $D_{main}$ is greater than that of a current-on threshold (i.e. Vth_main/Rg/M*N) of this negative feedback loop, the gate voltage of the main switching transistor $M_{main}$ will be greater than its own threshold voltage and the main switching transistor $M_{main}$ is turned on in the off cycle, so that the current ID_$M_{main}$ flows through the main switching transistor $M_{main}$, the forward current flowing through the main diode $D_{main}$ is reduced to the preset value; and when the magnitude of the forward current flowing through the main diode $D_{main}$ is less than that of the current-on threshold (i.e. Vth_main/Rg/M*N) of this negative feedback loop, the gate voltage at the gate of the main switching transistor $M_{main}$ will be less than its own threshold voltage and the main switching transistor $M_{main}$ is automatically turned off during its off cycle.

The main module 101, the diode-current sensing module 102, and the driving module 103 form an adaptive accelerated response circuit; the larger the magnitude of the initial current flowing through the main diode $D_{main}$, the faster the response of the negative feedback loop (that is, the adaptive accelerated response circuit), thereby bypassing and reducing the current flowing through the main diode $D_{main}$ to the preset value in a shorter period.

The above negative feedback loop reduces the forward current flowing through the main diode $D_{main}$ to the preset value, and the preset value is calculated as follows:

When the negative feedback loop is in a steady state, the magnitude of the turn-on current ID_$M_{main}$ of the main switching transistor $M_{main}$, which is turned on during the off cycle, is much greater than that of the current flowing through the main diode $D_{main}$; that is, an operating current $I_{sys}$ flowing through the system at this time almost all flows through the main switching transistor $M_{main}$, and only a tiny portion of the operating current $I_{sys}$ flows through the main diode $D_{main}$. This tiny portion of the operating current $I_{sys}$ can be ignored in the calculation. Taking a MOSFET power transistor being the main switching transistor $M_{main}$ as an example, when the operating current $I_{sys}$ is small, a drain-source voltage difference of the MOSFET power transistor is greater than an overdrive voltage ($V_{gs}-V_{th}$), and the MOSFET power transistor works in a saturation region. $V_{gs}$ is a gate-source voltage difference of the MOSFET power transistor, and $V_{th}$ is the threshold voltage of the MOSFET power transistor. According to basic knowledge of the field, $I_{sys}=\frac{1}{2}*\mu_n*C_{ox}*W/L*(V_{gs}-V_{th})^2$; where $\mu_n$ is a carrier mobility of the MOSFET power transistor, $C_{ox}$ is a gate capacitance per unit area of the MOSFET power transistor, W/L is the width to length ratio of the MOSFET power transistor;

$V_{gs}=\text{Sqrt}(2*I_{sys}/(\mu_n*C_{ox}*W/L))+V_{th}$,

When the negative feedback is in the steady state, the preset value ID_set of the main diode $D_{main}$ is given by:

$$\text{ID\_set}=V_{gs}/R_g/M*N \qquad (1)$$

That is: ID_set=(Sqrt(2*$I_{sys}$/($\mu_n*C_{ox}*W/L$))+$V_{th}$)/$R_g$/M*N

According to basic knowledge of the field, the forward voltage drop VD_main of the main diode $D_{main}$ is given by:

VD_main=VT*ln(ID_set/$I_s$), where VT is a temperature-voltage equivalent, and $I_s$ is an inverse saturation current;

That is, VD_main=VT*ln((Sqrt(2*$I_{sys}$/($\mu_n*C_{ox}*W/L$))+$V_{th}$)/$R_g$/M*N $I_s$)

In an embodiment, as shown in FIG. 2, we assume that the ratio of the junction area of the main diode $D_{main}$ to the junction area of the sensing diode $D_{sns}$ is 1E5 (i.e., 100,000), that the driving module 103 amplifies the sensing current by 20 times, and that the resistance value $R_g$ of the driving resistor $R_g$ is 50K ohms, in which case the current flowing through the system is 10 A. In conventional technology, the current of 10 A flowing through the system all flows through the main diode $D_{main}$ during the off cycle, causing the main diode $D_{main}$ to heat up, and when the current of 10 A flows through the main diode $D_{main}$, the forward voltage drop generated by the main diode $D_{main}$ is also large. In the present disclosure, the main switching transistor $M_{main}$ can be turned on during its off cycle and the main switching transistor $M_{main}$ usually has a very large width to length ratio; if the driving voltage at the gate of the main switching transistor $M_{main}$ is 3 V at this time, the current flowing through the main diode $D_{main}$ can be calculated using the formula (1) when the negative feedback loop is in a steady state, that is ID_set=$V_{gs}$/$R_g$/M*N=3/50K/20*1E5=300 mA.

It can be seen that in conventional technology, the current of 10 A flowing through the system all flows through the main diode $D_{main}$, which causes the main diode $D_{main}$ to heat up; in this present disclosure, only the current of 300 mA flows through the main diode $D_{main}$ when the negative feedback loop is in the steady state; therefore, the present disclosure can greatly reduce the current flowing through the main diode $D_{main}$. Because the current flowing through the main diode $D_{main}$ changes from 10 A to 300 mA, the voltage drop across the main diode $D_{main}$ is conservatively estimated to be reduced from 0.7 V or greater at 10 A to about 0.3 V at 300 mA, and the voltage difference between the source and the drain of the main switching transistor $M_{main}$ is about 0.3V, that is, the system power consumption is reduced from 7 W (10 A*0.7 V, where 10 A is the current flowing through the main diode $D_{main}$, and 0.7 V is the forward voltage drop generated by the main diode $D_{main}$ when the current of 10 A flows through the main diode $D_{main}$) to 3 W (10 A*0.3 V, where 10 A is the current flowing through the main switching transistor $M_{main}$, and 0.3 V is the forward voltage drop generated by the main switching transistor $M_{main}$ when the current of 10 A flows through the main switching transistor $M_{main}$), thus greatly improving system efficiency and reducing heat generation during the off cycle of the main switching transistor $M_{main}$.

As can be seen from the above examples, in the off cycle of the main switching transistor $M_{main}$, if a forward current flowing through the main diode $D_{main}$ exceeds a preset current threshold, the main switching transistor $M_{main}$ will be turned on during its off cycle, and then a majority portion of the forward current will then flow through the main switching transistor $M_{main}$, and only a tiny portion of the forward current will flow through the main diode $D_{main}$; when the magnitude of the forward current of the main diode $D_{main}$ is less than that of the preset current threshold, the main switching transistor $M_{main}$ is automatically turned off.

Embodiment 2

Figure 7:
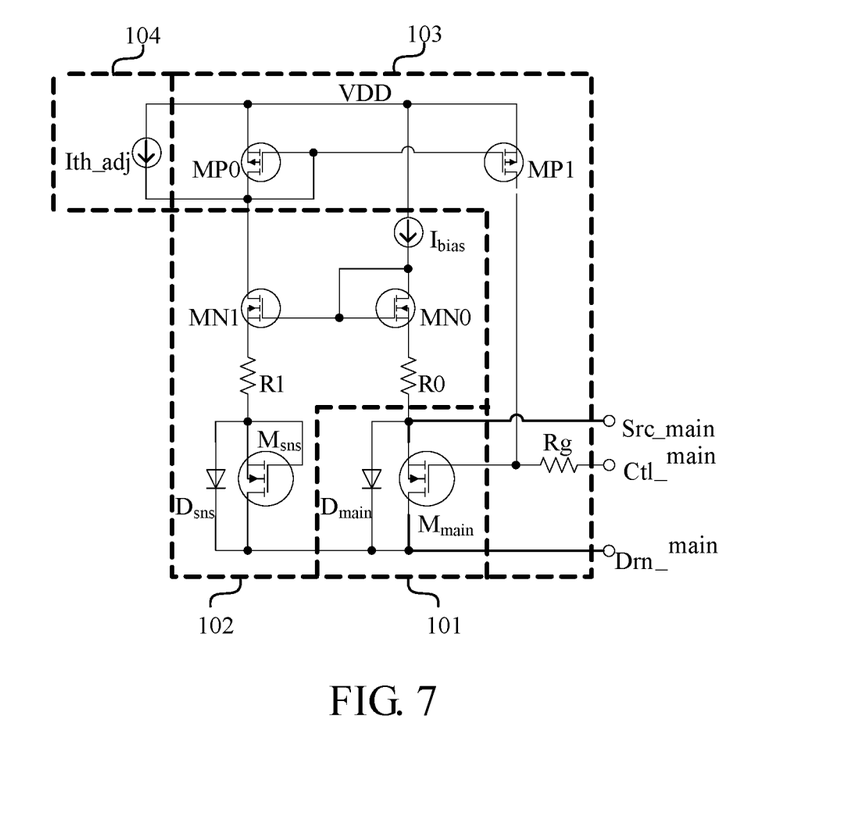
FIG. 7 shows an implementation of a control circuit for bypassing a diode current according to Embodiment 2 of the present disclosure.

As shown in FIG. 7, Embodiment 2 provides a control circuit for bypassing a diode current; compared to Embodiment 1, the control circuit described in this embodiment further includes a current threshold module 104; the current threshold module 104 is connected between the diode-current sensing module 102 and the driving module 103, and is for comparing the sensing current ID_sns with a preset threshold current Ith_adj, turning on the driving module 103 when a magnitude of the sensing current ID_sns is less than that of the preset threshold current Ith_adj, and turning on the driving module 103 when the magnitude of the sensing current ID_sns is greater than that of the preset threshold current Ith_adj.

As an example, as shown in FIG. 7, the current threshold module 104 includes a threshold current source; an input terminal of the threshold current source is connected to the supply voltage VDD, and an output terminal of the threshold current source is connected to an output terminal of the diode-current sensing module 102 and an input terminal of the driving module 103 respectively.

In one example, when the magnitude of the sensing current ID_sns is less than that of the preset threshold current Ith_adj provided by the threshold current source, the sensing current ID_sns is offset by the preset threshold current Ith_adj, at which time the voltage at the gate of the first mirror current transistor MP0 is at high level, that is, when the first mirror current transistor MP0 is in an off state, the driving module 103 is also in an off state; at this time the control circuit for bypassing the diode current is in a dormant state and the standby power consumption is very low. When the magnitude of the sensing current ID_sns is greater than that of the preset threshold current Ith_adj provided by the threshold current source, a current (whose value is the difference between the sensing current ID_sns and the preset threshold current Ith_adj) flows into the first mirror current transistor MP0, and the driving module 103 is in the on state. It should be noted that when the control circuit for bypassing the diode current includes the current threshold module 104, the presence of the preset threshold current Ith_adj adjusts the magnitude of the corresponding preset value to be $(V_{th}\_main/R_g/M+Ith\_adj)*N$.

The present disclosure also provides another control method for performing current bypassing on the main diode $D_{main}$; the main diode $D_{main}$ is connected in parallel with a main switching transistor $M_{main}$, and connected to a source and a drain of the main switching transistor $M_{main}$; the control method includes:

sensing, by a diode-current sensing module 102, a current flowing through the main diode $D_{main}$ to generate a sensing current ID_sns; and comparing, by a current threshold module 104, the sensing current ID_sns with a preset threshold current Ith_adj, turning off the driving module 103 when a magnitude of the sensing current ID_sns is less than that of the preset threshold current Ith_adj, and turning on the driving module 103 when the magnitude of the sensing current ID_sns is greater than that of the preset threshold current Ith_adj.

generating, by the driving module 103, a driving current Idrv proportional to the sensing current ID_sns to drive the main switching transistor $M_{main}$ to be turned on when the driving module 103 is turned on.

The main module 101, the diode-current sensing module 102, and the driving module 103 form a negative feedback loop, thereby reducing the current flowing through the main diode $D_{main}$ to a preset value.

In summary, the control circuit for bypassing the diode current and the control method provided in the preset disclosure use the negative feedback loop (formed by the main module, the diode-current sensing module, and the driving module) to turn on the main switching transistor, thereby bypassing and regulating the current flowing through the main diode, reducing the current flowing through the main diode to the preset value, and controlling the current flowing through the main diode so that it is within a limited range. The preset disclosure has a negative feedback attribute. A turn-on threshold (i.e., the preset threshold current) may also be configured so that it can be used to automatically turn on or turn off the circuit. The circuit structure of the preset disclosure is simple and easy to implement.

The above embodiments are illustrative of the principles and benefits of the disclosure rather than restrictive of the scope of the disclosure. Persons skilled in the art can make modifications and changes to the embodiments without departing from the spirit and scope of the disclosure. Therefore, all equivalent modifications and changes made by persons skilled in the art without departing from the spirit and technical concepts disclosed in the disclosure shall still be deemed falling within the scope of the claims of the disclosure.

What is claimed is:

1. A control circuit for bypassing a diode current, wherein the control circuit comprises: a main module, a diode-current sensing module, a driving module, and a current threshold module;

wherein the main module comprises a main switching transistor and a main diode, wherein the main diode is connected in parallel with the main switching transistor, and connected to a source and a drain of the main switching transistor;

wherein the diode-current sensing module is connected to two ends of the main diode, and is for sensing a current flowing through the main diode to generate a sensing current;

wherein the driving module is connected to an output terminal of the diode-current sensing module and a gate of the main switching transistor respectively, and is for generating a driving current proportional to the sensing current to drive the main switching transistor to be turned on;

wherein the main module, the diode-current sensing module, and the driving module form a negative feedback loop to reduce the current flowing through the main diode to a preset value; and wherein the current threshold module is connected between the diode-current sensing module and the driving module, for comparing the sensing current with a preset threshold current, turning off the driving module when a magnitude of the sensing current is less than that of the preset threshold current, and turning on the driving module when the magnitude of the sensing current is greater than that of the preset threshold current.

2. The control circuit according to claim 1, wherein the diode-current sensing module comprises a sensing diode; wherein the sensing diode senses the current flowing through the main diode and generates the sensing current, by making a voltage across the sensing diode positively related to or equal to a voltage across the main diode.

3. The control circuit according to claim 2, wherein the diode-current sensing module comprises an error amplifier, a source follower transistor, and the sensing diode; wherein a non-inverting input terminal of the error amplifier is connected to an anode of the main diode, an inverting input terminal of the error amplifier is connected to a source of the source follower transistor and an anode of the sensing diode respectively, an output terminal of the error amplifier is connected to a gate of the source follower transistor, a drain of the source follower transistor is used as the output terminal of the diode-current sensing module, and a cathode of the sensing diode is connected to a cathode of the main diode.

4. The control circuit according to claim 2, wherein the diode-current sensing module comprises a bias current source, a first common-gate transistor, a second common-gate transistor, a sensing switching transistor, and the sensing diode;

wherein an input terminal of the bias current source is connected to a supply voltage, an output terminal of the bias current source is connected to a drain of the first common-gate transistor, a source of the first common-gate transistor is connected to an anode of the main diode, a gate of the first common-gate transistor is connected to the drain of the first common-gate transistor and a gate of the second common-gate transistor respectively, a drain of the second common-gate transistor is used as the output terminal of the diode-current sensing module, a source of the second common-gate transistor is connected to a source of the sensing switching transistor and an anode of the sensing diode respectively, a gate of the sensing switching transistor is connected to the source of the sensing switching transistor, a drain of the sensing switching transistor is connected to a cathode of the sensing diode and a cathode of the main diode respectively.

5. The control circuit according to claim 4, wherein the diode-current sensing module further comprises a first resistor, wherein the first resistor is connected between the source of the first common-gate transistor and the anode of the main diode.

6. The control circuit according to claim 4, wherein the diode-current sensing module further comprises a first resistor and a second resistor; wherein the first resistor is connected between the source of the first common-gate transistor and the anode of the main diode, and the second resistor is connected between the source of the second common-gate transistor and the anode of the sensing diode.

7. The control circuit according to claim 1, wherein the driving module comprises a first current mirror transistor, a second current mirror transistor, and a driving resistor; wherein a source of the first current mirror transistor is connected to a source of the second current mirror transistor and then to a supply voltage, a drain of the first current mirror transistor is connected to the output terminal of the diode-current sensing module, a gate of the first current mirror transistor is connected to the drain of the first current mirror transistor and a gate of the second current mirror transistor respectively, a drain of the second current mirror transistor is connected to a first terminal of the driving resistor and is used as an output terminal of the driving module, and a second terminal of the driving resistor is connected to a switching control signal of the main switching transistor.

8. The control circuit according to claim 1, wherein the driving module comprises a first current mirror transistor, a second current mirror transistor, a sampling resistor, an N-metal-oxide-semiconductor (NMOS) driving transistor, and a P-metal-oxide-semiconductor (PMOS) driving transistor; wherein a source of the first current mirror transistor is connected to a source of the second current mirror transistor and then connected to a supply voltage, a drain of the first current mirror transistor is connected to the output terminal of the diode-current sensing module, a gate of the first current mirror transistor is connected to the drain of the first current mirror transistor and a gate of the second current mirror transistor respectively, a drain of the second current mirror transistor is connected to a first terminal of the sampling resistor, a gate of the NMOS driving transistor and a gate of the PMOS driving transistor respectively, a second terminal of the sampling resistor is connected to a source of the main switching transistor, a drain of the NMOS driving transistor is connected to the supply voltage, a source of the NMOS driving transistor is connected to a source of the PMOS driving transistor and is used as an output terminal of the driving module, the output terminal of the driving module is connected to a gate of the main switching transistor, and a drain of the PMOS driving transistor is connected to the source of the main switching transistor;

wherein a threshold voltage of the PMOS driving transistor is less than a threshold voltage of the main switching transistor.

9. The control circuit according to claim 8, wherein the driving module further comprises a PMOS switching transistor; wherein a source of the PMOS switching transistor is connected to the supply voltage, a drain of the PMOS switching transistor is connected to the gate of the NMOS driving transistor, and a gate of the PMOS switching transistor is connected to a switching control signal of the PMOS switching transistor.

10. The control circuit according to claim 1, wherein the driving module comprises a first current mirror transistor, a second current mirror transistor, a sampling resistor, a first triode, and a second triode; wherein a source of the first current mirror transistor is connected to a source of the second current mirror transistor and then connected to a supply voltage, a drain of the first current mirror transistor is connected to the output terminal of the diode-current sensing module, a gate of the first current mirror transistor is connected to the drain of the first current mirror transistor and a gate of the second current mirror transistor respectively, a drain of the second current mirror transistor is connected to a first terminal of the sampling resistor, a base of the first triode and a base of the second triode respectively, a second terminal of the sampling resistor is connected to a source of the main switching transistor, a collector of the first triode being is connected to the supply voltage, an emitter of the first triode is connected to an emitter of the second triode and is used as an output terminal of the driving module, the output terminal of the driving module is connected to a gate of the main switching transistor, a collector of the second triode is connected to the source of the main switching transistor; wherein a turn-on voltage of the second triode is less than a threshold voltage of the main switching transistor.

11. The control circuit according to claim 10, wherein the driving module further comprises a PMOS switching transistor; wherein a source of the PMOS switching transistor is connected to the supply voltage, a drain of the PMOS switching transistor is connected to a base of the first triode, and a gate of the PMOS switching transistor is connected to a switching control signal of the PMOS switching transistor.

12. The control circuit according to claim 1, wherein the current threshold module comprises a threshold current source, wherein an input terminal of the threshold current source is connected to the supply voltage, and an output terminal of the threshold current source is connected to an output terminal of the diode-current sensing module and an input terminal of the driving module respectively.

13. A control method, for performing current bypassing on a main diode, wherein the main diode is connected in parallel with a main switching transistor, and connected to a source and a drain of the main switching transistor, wherein the control method comprises:
- sensing, by a diode-current sensing module, a current flowing through the main diode to generate a sensing current;
- comparing the sensing current with a preset threshold current, turning off the driving module when a magnitude of the sensing current is less than that of the preset threshold current, turning on the driving module when the magnitude of the sensing current is greater than that of the preset threshold current; and
- generating, by a driving module, a driving current proportional to the sensing current to drive the main switching transistor to be turned on;
- wherein the main module, the diode-current sensing module, and the driving module form a negative feedback loop to reduce the current flowing through the main diode to a preset value.

14. The control method according to claim 13, wherein the step of sensing the current flowing through the main diode to generate the sensing current comprises:
- sensing the current flowing through the main diode and generating the sensing current by making a voltage across a sensing diode in the diode-current sensing module positively related to or equal to a voltage across the main diode.

* * * * *